United States Patent [19]

Shigeta

[11] 4,163,454
[45] Aug. 7, 1979

[54] PROCESSING EQUIPMENT FOR USE IN THE PROCESSING OF A PHOTOENGRAVING CYLINDER

[75] Inventor: Tatsuo Shigeta, Nagareyama, Japan

[73] Assignee: Kabushiki Kaisha Think Laboratory, Japan

[21] Appl. No.: 884,152

[22] Filed: Mar. 7, 1978

[30] Foreign Application Priority Data

Oct. 28, 1977 [JP] Japan ............................ 52-144901[U]
Nov. 30, 1977 [JP] Japan ............................ 52-160638[U]

[51] Int. Cl.² .................................................. B08B 3/08
[52] U.S. Cl. ................................... 134/57 R; 134/83; 134/160
[58] Field of Search ............ 134/57 R, 76, 78, 82–83, 134/142, 160

[56] References Cited
U.S. PATENT DOCUMENTS

| | | | |
|---|---|---|---|
| 2,124,460 | 7/1938 | Cary et al. | 134/142 X |
| 3,496,046 | 2/1970 | Lootvoet | 134/57 R X |
| 3,641,906 | 2/1972 | Orr et al. | 134/57 R |
| 3,888,270 | 6/1975 | Crapet | 134/57 R |
| 3,986,518 | 10/1976 | Sato | 134/57 R |

Primary Examiner—Robert L. Bleutge
Attorney, Agent, or Firm—Holman & Stern

[57] ABSTRACT

Equipment designed to automatically process a photoengraving cylinder through a variety of processes including plating on a metal roll, surface polishing, corrosion, development, printing and the like. In order to make more efficient such processes, this invention is directed to an equipment improvement which can automatically determine the condition of a cylinder during any process steps common to any of such processes, and further move a roller to be processed (hereinafter called a photoengraving cylinder) successively during the whole sequence of steps of work.

3 Claims, 7 Drawing Figures

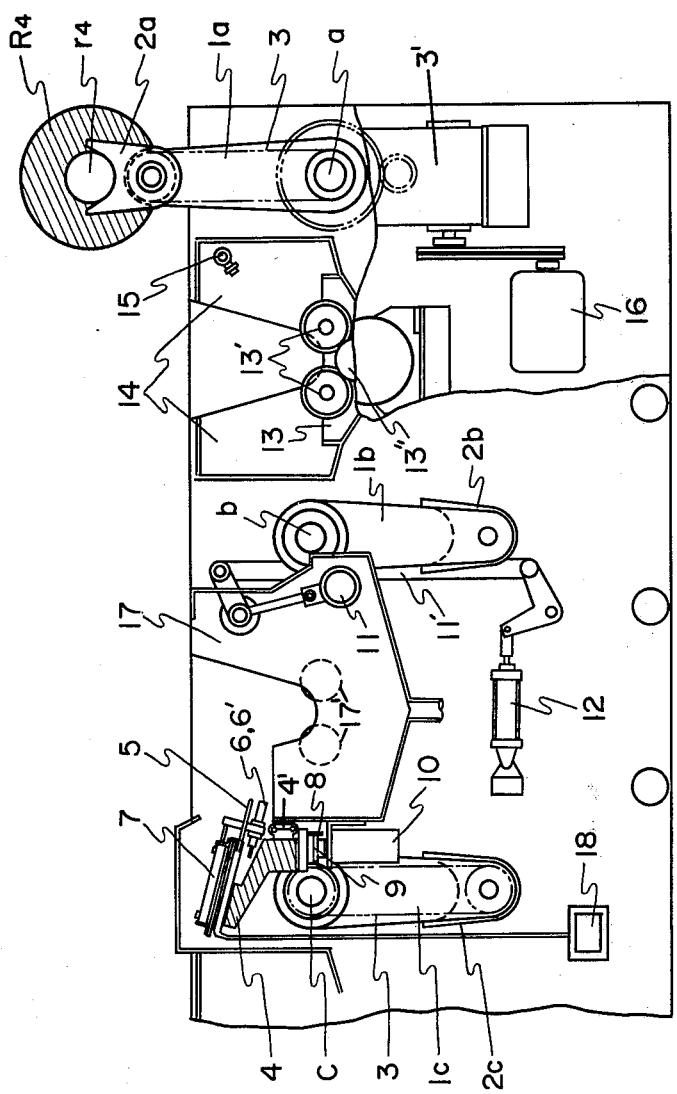
FIG. 2 (1)

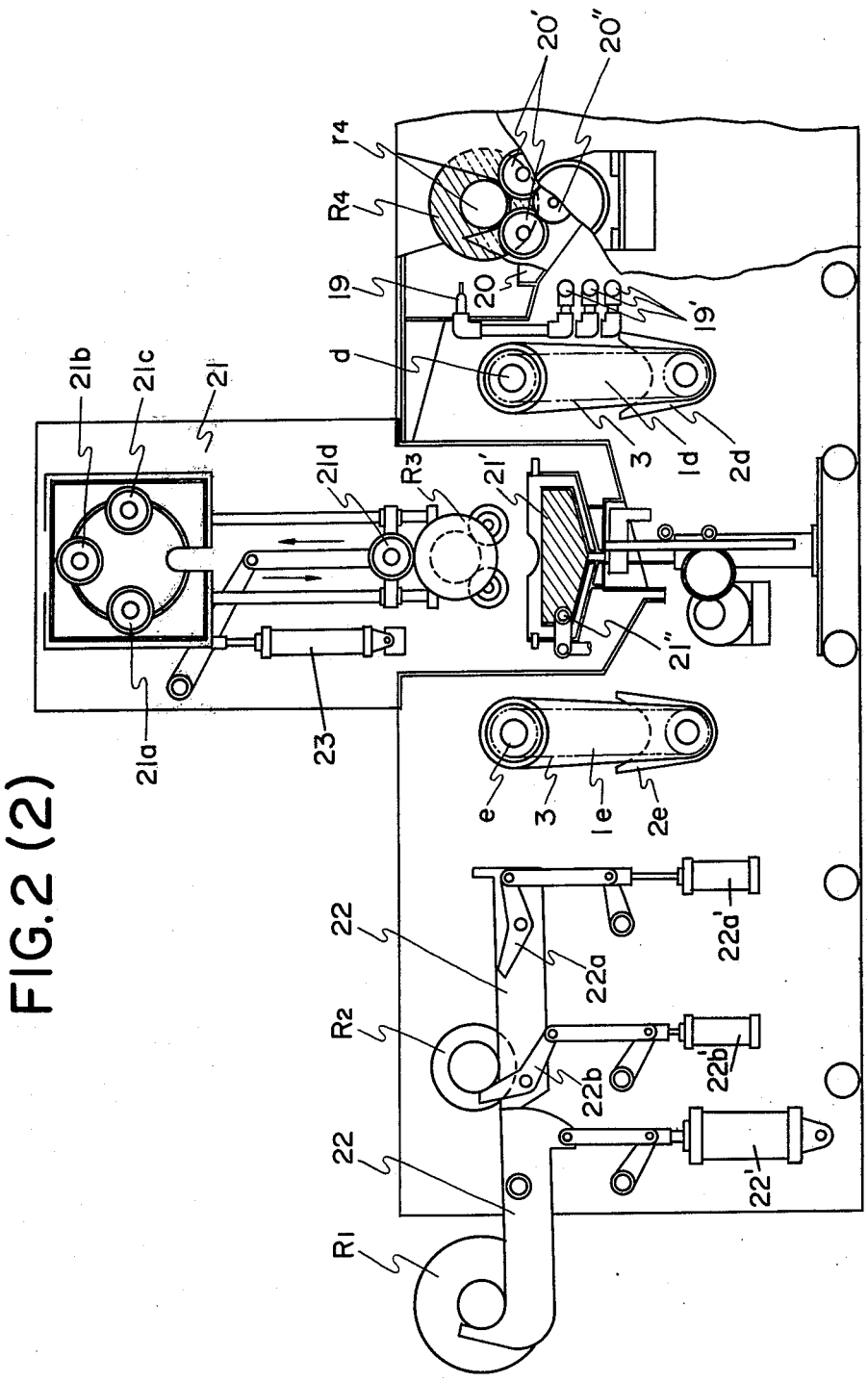

FIG. 3 (1)
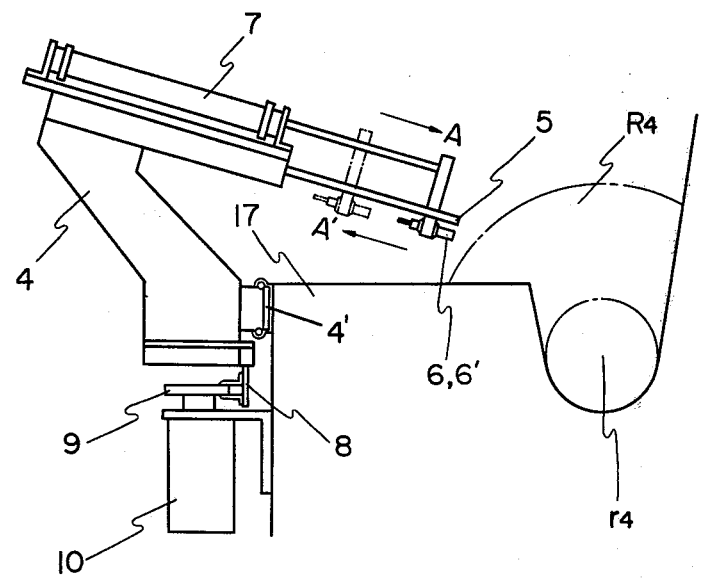
FIG. 3 (2)
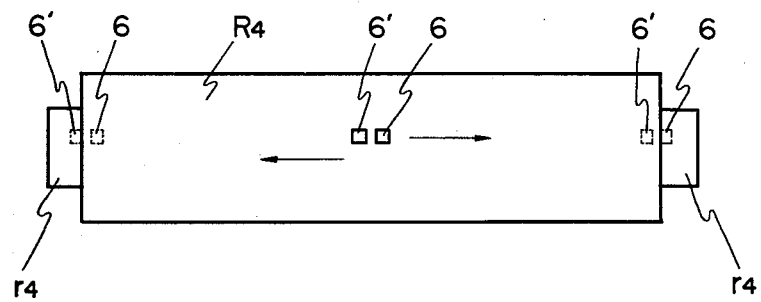

PROCESSING EQUIPMENT FOR USE IN THE PROCESSING OF A PHOTOENGRAVING CYLINDER

BACKGROUND OF THE INVENTION

This invention relates to an equipment for automatically processing a cylinder to be photoengraved in the field of the photoengraving. In the prior art, many different steps are involved in the processing of a cylinder to be engraved. It is, for example, a common practice that in the development of the image to be photoengraved on a cylinder, the cylinder is placed horizontally over a processing bath, and the various liquids are then successively changed, accordingly as the process of development proceeds. In other words, the cylinder remains stationary and the liquids are changed. In the case where a cylinder is to be processed is moved from a first bath to a second one, it is essentially required to move a cylinder by hand or by simple mechanical means such as hanging of a cylinder from a moving band. Thus, it is possible to process a second cylinder only when all of the processing steps on the first cylinder are finished. Given such practice, improvements in both precision and efficiency of such processing are difficult.

SUMMARY OF THE INVENTION

According to this invention, there is provided an improved equipment which can meet efficiently such defects as stated above in a conventional process by automatically determining the condition of a cylinder during process steps common to a variety of processes, and successively move a photoengraving cylinder through the steps. In the case of the development work, for example, a plurality of processing baths are placed on a base floor, with a plurality of shafts each having a pair of support arms for holding a photoengraving cylinder rotatably mounted between the baths in such a manner that the rotating motion of a pair of said arms and the effect of these baths are cooperative during a single step of processing, the dimensions and diameter of a passing cylinder being measured automatically before the completion of the whole process, and the following condition of the cylinder can positively be determined, thus resulting in a smooth and efficient performance of the whole process.

An automatic system which can successfully determine the condition of the cylinder during process steps and move the same according to the present invention is extensively applicable to other processes for a photoengraving cylinder.

BRIEF DESCRIPTION OF THE DRAWINGS

FIG. 1(2) is a front view shown from the side of the conveyor mechanism;

FIG. 2(1) shows the arrangement for the first half portion of a particular process;

FIG. 2(2) shows the arrangement for the last half portion of the process of FIG. 2(1);

FIG. 3(1) shows a side view of a slidable member for measurement of a photoengraver;

FIG. 3(2) shows the embodiment of measurement of a dimension of a photoengraving cylinder by using proximity switches.

DESCRIPTION OF THE PREFERRED EMBODIMENT

The following description will be given with respect to an example detailing the development of a photoengraving cylinder for which the processing of rearrangement of the printing has been completed, in conjunction with the drawings.

Figure 1:
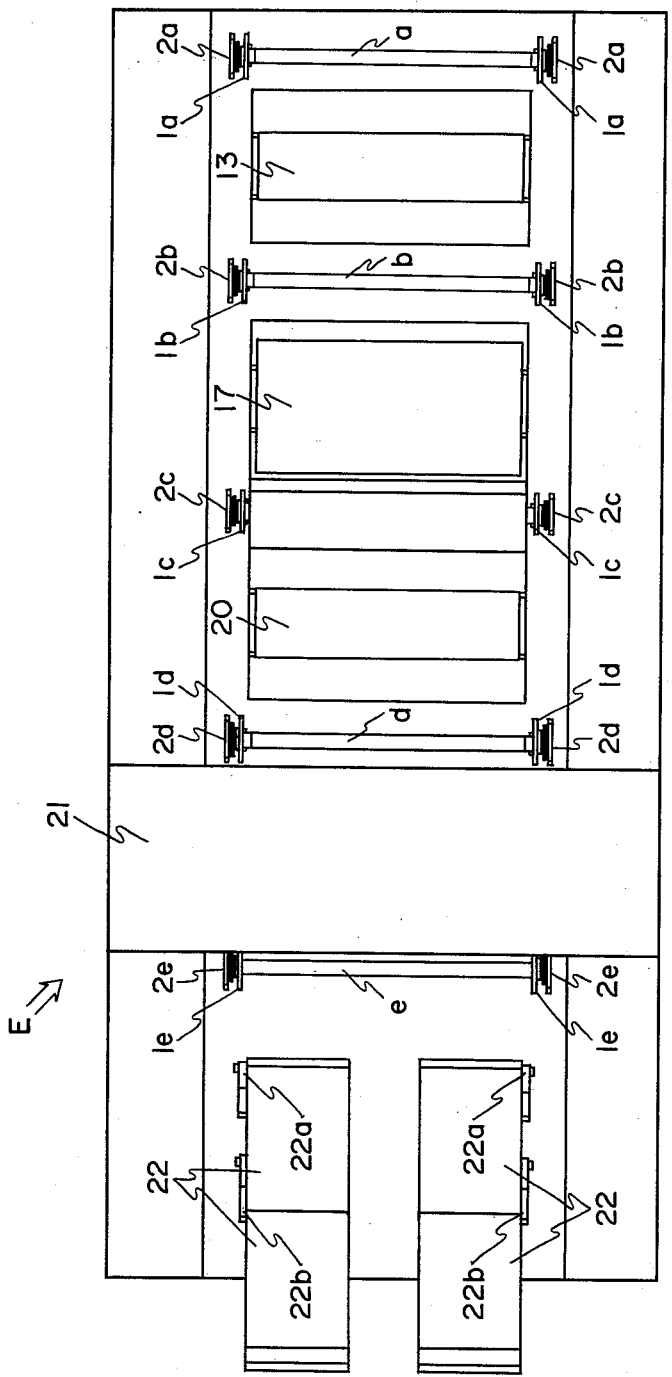
FIG. 1(1) is a top plan view showing a disposition of the principal parts installed in an equipment.
Figure 1:
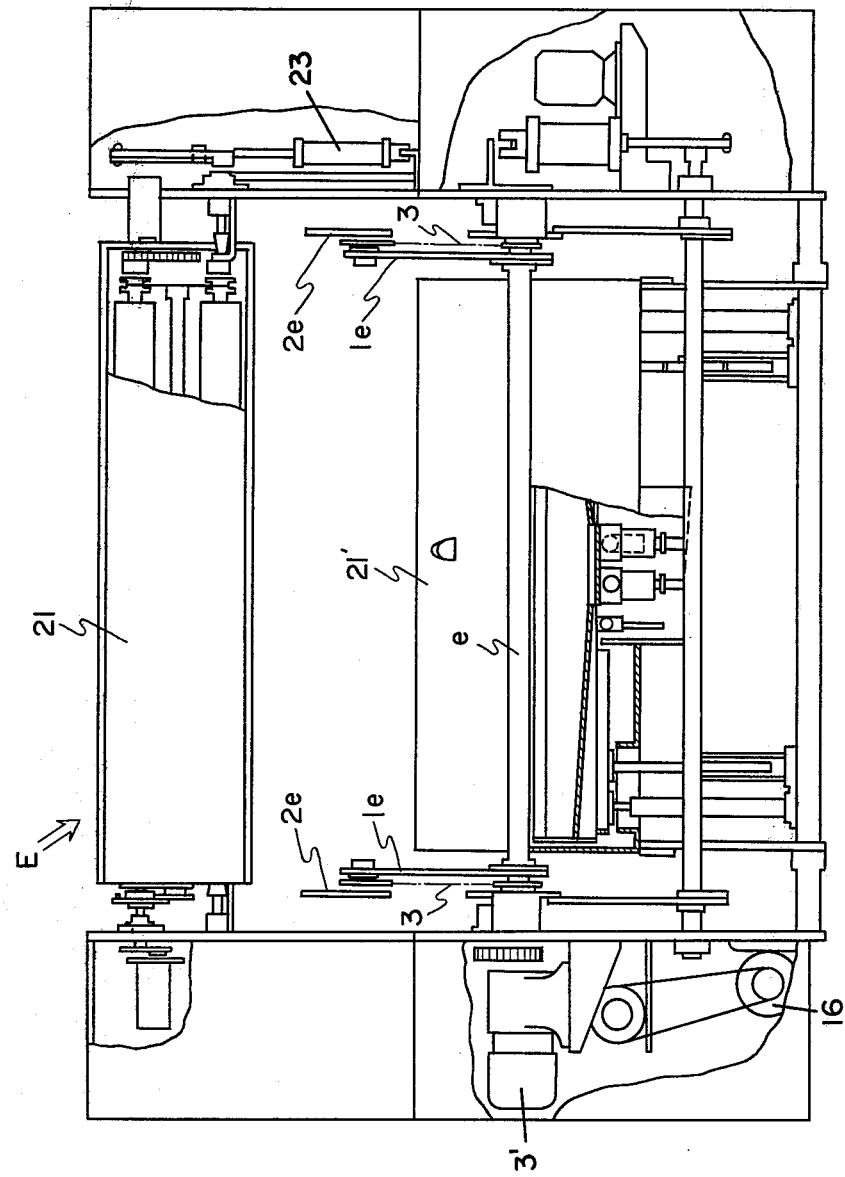

FIG. 1(1) is a top plan view showing a disposition of the principal parts present in an equipment E. There is a hot water washing bath 13 for a development step and/or for stripping off a sheet of basic paper made of photosensitive material, installed between the shaft a and b. The shaft a is equipped with a pair of right and left support arms 1a and U-shaped support panels 2a on both ends of the support arms. The shaft b is arranged in the same manner as shaft a and is located in parallel thereto. An alcohol atomizing bath 17 for the development process is installed between shaft b and shaft c which is arranged in the same manner as the shaft a.

A cold water atomizing bath 20 for cooling the surface of a photoengraving cylinder (FIG. 2(1) as described later, is installed between shaft c and shaft d which are arranged in the same manner as shaft a.

Between shaft d and shaft e, a dehydration mechanism 21 is installed to dry the surface photoengraving cylinder. The dehydration mechanism 21 is located on the highest portion of the equipment E, and is provided in addition with a volatile liquid bath 21' which is positioned under mechanism 21.

The last process portion of equipment E is the conveyor mechanism 22 for the photoengraving cylinders. This mechanism 22 has stoppers 22a and 22b in order to accommodate the forward motion of more than two (2) photoengraving cylinders.

FIG. 1(2) illustrates a front elevational view of equipment E shown from the side of the conveyor mechanism 22. FIG. 2(1) illustrates a disposition of the principal parts which cooperate with each other between an alcohol atomizing bath 17, in the first half portion of the process steps shown, and a hot water wash 13. A side view of the support arms 1a, 1b, and 1c, and each of a pair of support panels 2, 2b, and 2c rotatably mounted on the shaft of both ends of each of a pair of said support arms is shown. Namely, a pair of the support arms which are each provided with a driving motor 16, rotates with a photoengraving cylinder R4 supported for every one of the process steps. Each pair of the support arms can be rotated independently. Consequently, support panels 2a, 2b, and 2c are rotatably mounted in synchronism with the rotation of each support arm mentioned above, by a chain 3, a gear mechanism 3' which is associated with each chain 3 and a motor 16. The panels 2a, 2b, and 2c can rotate at right angles with respect to a base floor.

The intervals between the shafts a, b, and c of support arms, are equal to the distance of a single rotating motion of each support arm for shifting the cylinder R4 to a following process step.

The hot water washing bath 13, which is receiving a shifting photoengraving cylinder R4 in FIG. 2(1), has a pair of rollers 13' and a gear 13" adapted to cause rollers 13' to rotate. A tank for storing hot water (not shown) is mounted on the back of the bath 13. A wall of the bath 13 is indicated with 14, and 15 is a hot water atomizing nozzle.

An alcohol atomizing bath 17 which is one of the first steps of the development process, has a pair of rollers 17' which are similar to the construction of the rollers 13' of the bath 13 and a roller 11 for equalizing the finishing of atomized alcohol or acetone. The roller 11 is arranged rotatably through a pistion 11' which is connected to support panel 2b of the support arm 1b, and a pressure cylinder 12 on the lower end of the external side of the alcohol atomizing bath 17.

An atomizing nozzle 5 on a slidable member 4 is provided. A pump 18 supplies alcohol or acetone from an atomizing tank (not shown) which is placed in the back of the alcohol atomizing bath 17. The member 4 is inserted into a groove 4' in the rear external wall of an alcohol atomizing bath 17, and moves slidably along the groove 4' through a slidable rack 8 engaged with pinion 9 and motor 10. A pair of proximity switches 6,6' and a pressure cylinder 7 are installed on the slidable member 4 as well as the atomizing nozzle 5.

FIG. 2(2) is a disposition of the principal parts of the last half portion of the particular process shown. A cooling atomizing bath 20 is equipped with a pair of rollers 20' for low speed revolution of the photoengraving cylinder R4. A driving gear 20" drives the rollers 20'. Cooling water for washing of the cylinder R4 is atomized through a nozzle 19 from a tank (not shown), but in order to equally spray against photoengraving cylinders of various sizes, a plurality of nozzles 19' are disposed at suitable distances from the cylinders spanning in the horizontal direction. The support arm 1d is shown ready to move between the cooling bath 20 and the dehydration mechanism 21 described below.

The dehydration mechanism 21 dehydrates a photoengraving cylinder by controllingly moving one by one different drying rollers 21a, 21b, 21c, 21d into position against the cylinder to be dried.

A photoengraving cylinder R3 of FIG. 2(2) is already finished development and is moving along one half step of processing in advance of a photoengraving cylinder R4 in this example. The cylinder R3 is shifted into volatile liquid (alcohol, for example) bath 21' which is installed in the dehydration mechanism 21. The cylinder R3 is shown in contact with drying roller 21d of the mechanism 21. Roller 21d bears the similar action to operating of other awaiting rollers 21a, 21b, and 21c in a roller box in upper side of mechanism 21.

In this process, when a photoengraving cylinder is finished drying, each roller in said box rotates only one (1) section (90 degrees). At this time, the roller 21d goes down from a box by an air cylinder 23, and contacts in low speed revolution the cylinder R3. In this case, moisture on the surface of the cylinder R3 is eliminated in the bath 21'. Alcohol from a tank (not shown) on the back of the volatile liquid bath 21', is atomized from nozzle 21".

Drying roller 21d then rises and is returned to the box. Next, the dried cylinder R3 is conveyed to the conveyor mechanism by rotation of the support arm 1e. Typically a photoengraving cylinder R4 in this example is processed in the cooling bath 20 for five (5) minutes to ten (10) minutes while the cylinder R3 remains for approximately ten (10) minutes in the dehydration steps.

Reference numeral 22 in FIG. 2(2) designates the ordinary mechanism to convey a plurality of photoengraving cylinders. This mechanism has stoppers 22a, and 22b which are worked by air cylinders 22a', 22b'. Another cylinder R1 is shown ready for being conveyed outside the process, and R2 is a cylinder stopped by stopper 22b.

Figure 4:
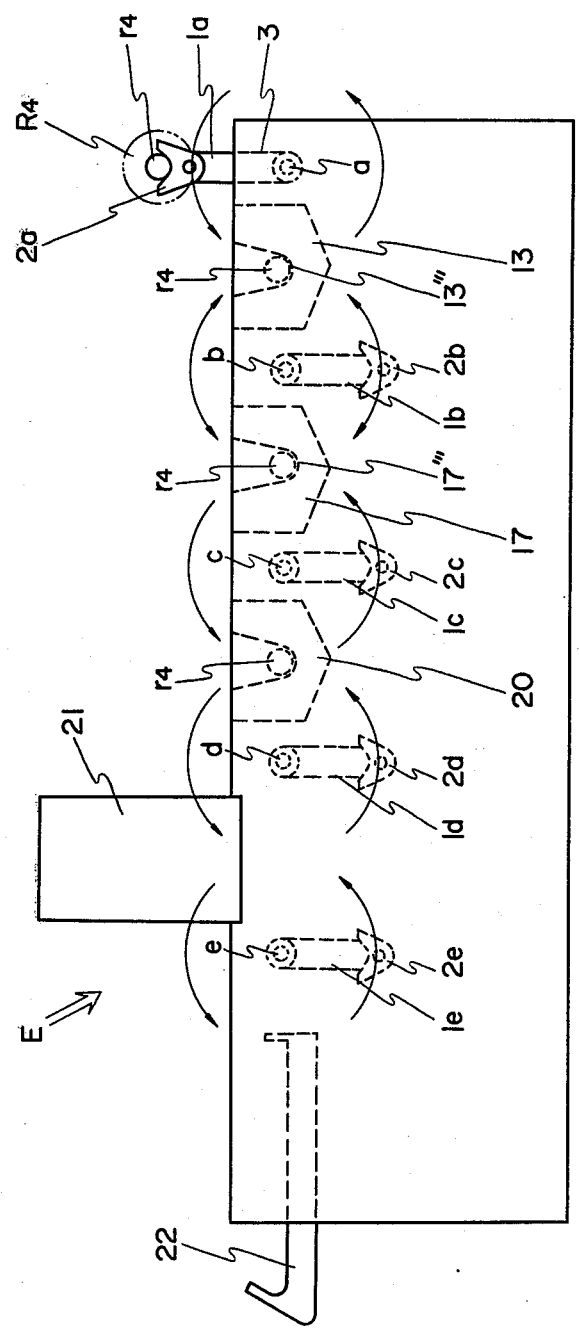
FIG. 4 shows shifting operation of a photoengraving cylinder.

The equipment E of the present invention is constructed as described hereinbelow. Therefore, as shown in FIG. 4, a photoengraving cylinder R4 for a process of development, is continuously shifted into each bath as each step is performed.

Namely, each of the support arms 1a, 1b, 1c, 1d, and 1e is able to rotate independently in each direction. The support arms 1b, 1c, 1d and 1e are shown vertically downward from each of the shafts b, c, d, e. The first support arm 1a and a support panel 2a are shown vertically upward from the shaft a, with the shaft r4 of a photoengraving cylinder R4 ready for processing placed on the support panel 2a. When the shaft r4 of a photoengraving cylinder R4 is placed on a support panel 2a, the panel 2a is not inclined by itself, but, rotates in synchronism with rotating motion of the support arm 1a. So, the shaft r4 is moved to contacting portion 13''' of rollers 13' (FIG. 2(1)) in the hot water washing bath 13. However hot water is not permanently kept in bath 13. Thus, the surface of a photoengraving cylinder R4 when shifted into the bath 13 remains unchanged, and can be further shifted from bath 13 to the contacting portion 17''' in the alcohol atomizing bath 17 by rotating motion of the support arm 1b and support panel 2b. In this bath, alcohol or acetone is atomized from nozzle 5 (FIG. 2(1)) of the alcohol atomizing bath 17, and either liquid mentioned above is atomized equally over the surface of the photoengraving cylinder R4. The roller 11 (FIG. 2(1)) in bath 17, performs such action of the process for the development as desired. Accordingly, if there is photo-sensitive material such as soluble plastic film adhered to the cylinder R4, then, this film is melted away in bath 17. Similarly, if the material consists of gelatine coating paper, this basic paper becomes in condition to be easily stripped off.

At the same time when the previous process step is finished, the condition of the cylinder for the following step of the process is automatically determined. The following action of measuring the dimensions and the diameter of the photoengraving cylinder itself commences within a short time thereafter. It is necessary because photoengraving cylinders have a diameter in the range of one-hundred (100) m/m to six-hundred (600) m/m and different dimensions. It is important that each cylinder be successfully and evenly processed. In measuring, a pair of proximity switches 6,6' on a slidable member 4 at the outer side of the alcohol atomizing bath 17 shown in FIG. 3(1), move near to the photoengraving cylinder R4 which is not moving, (shown by the arrow) in the range of five (5) m/m to ten (10) m/m away by the action of a pressure cylinder 7, and are stopped radially at that point. The diameter of the cylinder R4 is read through the pair of proximity switches 6,6' by a computer (not shown) so that the diameter of a photoengraving cylinder R4 can be noted. Then as shown in FIG. 3(2), the proximity switches are positioned at the transverse center of the photoengraving cylinder R4, and are moved by the slidable member 4 along the axis of cylinder Rd. Proximity switch 6 is stopped at the outer point of one side end of the cylinder R4. When the slidable member 4 moves in the opposite direction to above-mentioned, proximity switch 6' is stopped at the outer point of the other side of the cylinder R4 in the same manner as mentioned above. Consequently, the mentioned above length of a cylinder R4

(the distance of two switches) can be noted through the electric signal and a computer.

After measuring, proximity switches 6,6' return in the arrow A' direction to their original position in FIG. 2(1).

From the above measurements, the tangential speed of the surface of the cylinder R4, its immersing level in a bath, a surface area and the weight of a cylinder R4 can be indirectly calculated in advance. Thus, it becomes possible to control, in an appropriate manner, the numerical value of a current and voltage in the engraving step, and the consumption quantity of processing liquid during the development through the measurement of the surface area, and necessary processing time for both hot water washing and cooling of the cylinder R4 through the measurements and calculation of the weight thereof.

When the above-mentioned previous process step for the development and the measuring are terminated, as shown in FIG. 4, the support arm 1b rotates in the direction opposite to that through which it was rotated prior to measuring step so that the photoengraving cylinder R4 moves backward to a contacting portion 13''' of the hot water washing bath 13 which is sequentially physically first.

In the bath 13, hot water of about forty-five (45°) degrees C. to forty-seven (47°) C. is atomized from the hot water nozzle 15, and the cylinder R4 is washed, the process of development being completed by the sensitive action. At this time, if there was basic paper on the surface of a cylinder R4, it is stripped off.

The next process step in FIG. 4 is to shift the photoengraving cylinder R4 after a hot water process step, back to the contacting portion 17''' of bath 17. The nozzle 5 of bath 17 is closed, accordingly, the temperature of the surface of the photoengraving cylinder R4 is higher than room temperature because of the previous hot water washing. The support arm 1c rotates, and shifts the cylinder R4 into cooling bath 20. In this bath 20, cold water is atomized from nozzle 19 so that the surface of the cylinder is cooled to about twenty-two (22)° C. to twenty-three (23)° C. As roller 20' (FIG. 2(2)) rotates slowly in order to cool positively the entire surface, cold water atomizes from the other nozzle 19' (FIG. 2(2)) to meet various sizes of photoengraving cylinders.

The photoengraving cylinder R4 after obtaining a uniform surface the temperature moves via the rotation of the support arm 1d, and shifts into bath 21' in the lower side of the dehydration mechanism 21. The photoengraving cylinder R4 goes through the dehydration step described above in the mechanism 21, so that the surface of the photoengraving cylinder R4 becomes dried. The rotation of the last holding roller 1e moves cylinder R4 to the conveyor mechanism 22, on which it rests at an appropriate distance from other cylinders.

Thus a cylinder to be processed passes, without interruption through the necessary plurality of baths for development. The equipment accepts and adapts to any variety of dimensions and diameters of passing cylinders. The total number of process steps can be automated or sequenced in a batch fashion. Thus, it is possible to achieve a harmonious and efficient development process.

The sensing of the condition of process steps and the automatic processing in the present invention can be also applied to the continuous plating of different photoengraving cylinders, the polishing of the surface of such cylinders or the corrosion processing of such cylinders.

What is claimed is:

1. In combination with automatic processing equipment for processing a photoengraving cylinder having an axis including a plurality of processing baths and swinging support means for moving the cylinder between baths, a device comprising:
   a sliding member longitudinally slidably mounted in a groove on one of said baths,
   means for moving said sliding member longitudinally along said groove axially of the cylinder in said bath,
   a pair of proximity switches displacably mounted on said sliding member,
   means for displacing said pair of proximity switches radially relative to the cylinder, and
   means for computing processing factors from the dimensions of the cylinder sensingly connected to and controlling said means for moving and said means for displacing, said means for computing receiving its inputs from said pair of proximity switches whereby the axial length and diameter of the cylinder can be read and calculations therefrom performed.

2. The combination of claim 1 wherein said means for moving comprises a rack mounted on said sliding member, a pinion gear enmeshed with said rack, and a motor mounted on said bath operatively connected to said pinion gear.

3. The combination of claim 1 wherein said means for displacing comprises a pressure cylinder.

* * * * *